(12) United States Patent
Oji (10) Patent No.: US 8,536,681 B2
(45) Date of Patent: Sep. 17, 2013

(54) CMOS INTEGRATED CIRCUIT (75) Inventor: Hiroshi Oji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 110 days.

(21) Appl. No.: 12/914,522

(22) Filed: Oct. 28, 2010

(65) Prior Publication Data
US 2011/0037127 A1 Feb. 17, 2011

Related U.S. Application Data (63) Continuation of application No. 12/216,215, filed on Jul. 1, 2008, now abandoned.

(30) Foreign Application Priority Data

Jul. 2, 2007 (JP) .................................. 2007-173962

(51) Int. Cl.
H01L 21/8238 (2006.01)
H01L 29/02 (2006.01)
H01L 27/118 (2006.01)

(52) U.S. Cl.
USPC ............ 257/583; 257/206; 438/232; 438/233

(58) Field of Classification Search
USPC .......... 438/218, 229, 231, 232, 233; 257/206
See application file for complete search history.

(56) References Cited

U.S. PATENT DOCUMENTS

| 6,436,747 | B1 * | 8/2002 | Segawa et al. ................ 438/197 |
| 6,469,347 | B1 | 10/2002 | Oda et al. |
| 2003/0022434 | A1 * | 1/2003 | Taniguchi et al. ............ 438/240 |
| 2003/0203546 | A1 * | 10/2003 | Burbach et al. ............... 438/151 |
| 2004/0063264 | A1 | 4/2004 | Zheng et al. |
| 2004/0121599 | A1 * | 6/2004 | Aminpur et al. .............. 438/689 |
| 2009/0001465 | A1 * | 1/2009 | Tessier et al. ................. 257/347 |

FOREIGN PATENT DOCUMENTS

| EP | 1833087 | * 11/2005 |
| JP | 10-125915 | 5/1998 |

* cited by examiner

Primary Examiner — Fernando L Toledo
Assistant Examiner — Karen Kusumakar
(74) Attorney, Agent, or Firm — Rabin & Berdo, P.C.

(57) ABSTRACT

A MOS integrated circuit including an N-type silicide MOS transistor, an N-type non-silicide MOS transistor simultaneously formed with the N-type silicide MOS transistor, and an isolation film having an N conductivity type impurity formed on the N-type non-silicide MOS transistor.

11 Claims, 8 Drawing Sheets

| CONVENTIONAL FLOW | | NEW FLOW | | |
|---|---|---|---|---|
| Side Wall | TEOS ↓ SiN ↓ Etch Back ↓ TEOS ↓ | Side Wall | TEOS ↓ SiN ↓ Etch Back ↓ ↓ | (1A) |
| NSD | Litho ↓ Impla ↓ HF ↓ | PSD | Litho ↓ Impla ↓ ↓ | (1B) |
| PSD | Litho ↓ Impla ↓ RTA ↓ | NSD | TEOS ↓ Litho ↓ Impla ↓ | (1C) (1D) |
| PROTECT | USG ↓ Litho ↓ HF ↓ | PROTECT | Litho ↓ HF ↓ RTA ↓ | (1E) |
| SILICIDE | PRE-SPUTTERING CLEANING ↓ Cobalt SP | SILICIDE | PRE-SPUTTERING CLEANING ↓ Cobalt SP | (1F) |

CMOS INTEGRATED CIRCUIT

CROSS-REFERENCE TO RELATED APPLICATIONS

This is a continuation of application Ser. No. 12/216,215, filed on Jul. 1, 2008. This application claims the benefit of priority of Japanese application 2007-173962, filed Jul. 2, 2007. The disclosures of these prior U.S. and Japanese applications are incorporated herein by reference.

BACKGROUND OF THE INVENTION

1. Field of the Invention

The present invention relates to a CMOS integrated circuit, and more particularly, it relates to a CMOS integrated circuit mixedly provided with a silicified transistor and a non-silicified transistor.

2. Description of Related Art

A CMOS (Complementary Metal Oxide Semiconductor) integrated circuit has advantages such as small power consumption and a stable operation, and is widely applied to a VLSI (Very Large Scale Integrated Circuit). In recent years, a CMOS integrated circuit mixedly provided with transistors of different types has also been implemented.

For example, a CMOS integrated circuit in which part of transistors are silicide transistors and the other transistors are non-silicide transistors is implemented. In this integrated circuit, the silicide transistors exhibiting low gate, source and drain resistance values of about 15Ω can be utilized as transistors for high-speed operations, while the non-silicide transistors having excellent withstand voltage characteristics against external surge voltages, for example, can be utilized as input/output circuits to which high electrostatic withstand voltages are required. Therefore, a semiconductor integrated circuit chip mixedly provided with the different types of silicide transistors and non-silicide transistors can be used for various applications.

A conventional method of manufacturing a CMOS integrated circuit mixedly provided with silicide transistors and non-silicide transistors generally performs first an NSD step of forming source and drain regions for N-type transistors after forming gate electrodes on the surface of a silicon substrate, then a PSD step of forming source and drain regions for P-type transistors, and thereafter a step of covering the non-silicide transistors with oxide films and forming silicide films on the gate electrodes, the source regions and the drain regions of silicified transistors.

In this case, As$^+$ (arsenic) ions are implanted in the NDS step in order to form the N-type source and drain regions, while the implanted As$^+$ ions may punch through the gate electrodes. In order to prevent this, an oxide film (TEOS film, for example) having a thickness of about 180 Å must be deposited in advance of the NSD step, and the deposited TEOS film is removed with hydrofluoric acid after the NSD step.

When the transistors are selectively silicified, the non-silicified transistors must be covered with protective oxide films (TEOS films, for example). The silicifying step is carried out while depositing TEOS films having a thickness of about 500 Å, for example, on the non-silicide transistors. Therefore, the TEOS films must be removed by etching with hydrofluoric acid after the silicifying step.

As hereinabove described, the conventional method inevitably includes two steps of removing oxide films with hydrofluoric acid. In the steps of removing the oxide films by etching with hydrofluoric acid, isolation oxide films (STI oxide films, for example) are excessively scraped off due to overetching, to result in increase in borderless contact leakage.

The present invention has been proposed under the aforementioned circumstances, and a main object of the present invention is to provide a CMOS integrated circuit capable of ensuring a leakage margin for preventing increase in borderless contact leakage.

Another object of the present invention is to provide an improved CMOS integrated circuit mixedly provided with a silicide transistor and a non-silicide transistor.

Further another object of the present invention is to provide a method of manufacturing a CMOS integrated circuit reducing a hydrofluoric acid treatment step for removing an oxide film.

SUMMARY OF THE INVENTION

In the method of manufacturing a CMOS integrated circuit according to the present invention, a P well and an N well are formed, a PSD step of forming P-type source and drain regions in the N well is first carried out, and an NSD step of forming N-type source and drain regions in the P well is thereafter carried out, whereby an oxide film is deposited on the surface of a semiconductor substrate only once, and can be removed by a single step of etching with hydrofluoric acid. Therefore, the operating characteristics of formed devices can be desiredly maintained.

Particularly in a case of manufacturing an integrated circuit mixedly provided with a silicide transistor and a non-silicide transistor, increase in borderless contact leakage is suppressed in each transistor, and a semiconductor integrated circuit having excellent characteristics can be manufactured.

The foregoing and other elements, features, steps, characteristics and advantages of the present invention will become more apparent from the following detailed description of the preferred embodiments with reference to the attached drawings.

DETAILED DESCRIPTION OF PREFERRED EMBODIMENTS

FIGS. 1A to 1F are schematic sectional views showing partial steps in a method of manufacturing a CMOS integrated circuit according to an embodiment of the present invention. More specifically, FIGS. 1A to 1F are schematic sectional views showing in order principal steps in the method of manufacturing a CMOS integrated circuit mixedly provided with silicide transistors and non-silicide transistors.

Figure 1A:
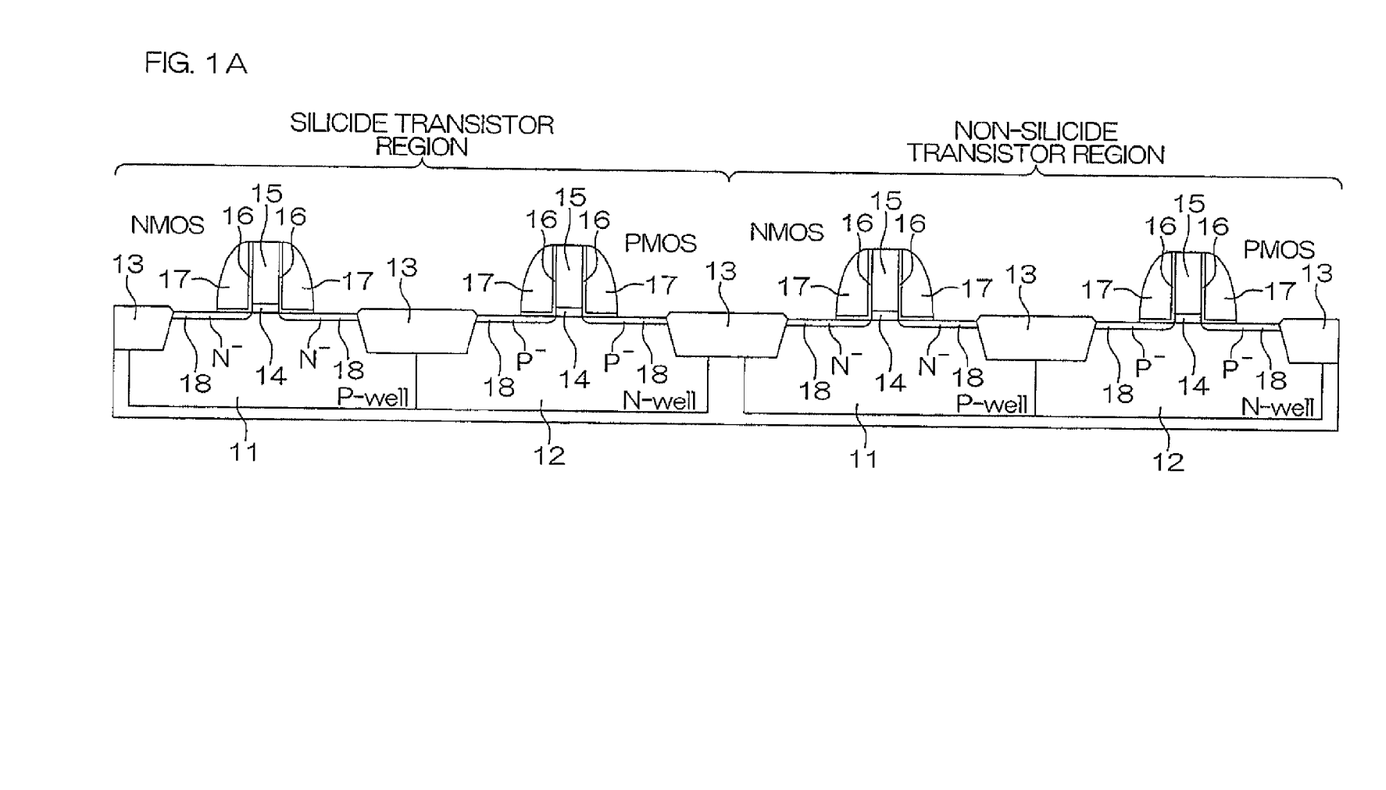
FIG. 1A is a schematic sectional view showing a principal step in a method of manufacturing a CMOS integrated circuit mixedly provided with silicide transistors and non-silicide transistors according to an embodiment of the present invention.

FIG. 1A is a schematic sectional view showing four isolated transistor regions provided with gate electrodes and sidewalls respectively in the midway of the manufacturing process. Referring to FIG. 1A, a reference numeral 11 denotes a P well and a reference numeral 12 denotes an N well, the P wells 11 and the N wells 12 of the so-called twin layer structure are formed on a silicon wafer, and these wells 11 and 12 are isolated from one another by isolation oxide films 13 of an STI (Shallow Trench Isolation) structure or the like. Gate electrodes 15 are provided on the P wells 11 and the N wells 12 respectively through gate oxide films 14 made of $SiO_2$. Each gate electrode 15 is made of polysilicon doped with an N conductivity type impurity such as phosphorus or arsenic, for example. A pair of sidewalls 17 made of SiN, for example, are formed on both sides of the gate electrode 15 through thin oxide films 16.

$N^-$ diffusion layers 18 are thinly formed on the surface layer regions of the P wells 11, to be bridged by the corresponding gate oxide films 14. On the other hand, $P^+$ diffusion layers 18 are thinly formed on the surface layer regions of the N wells 12, to be bridged by the corresponding gate oxide films 14. The diffusion layers 18, also referred to as extensions, are so provided as to prevent generation of hot electrons or the like by forming source and drain diffusion regions located under the sidewalls 17 so as to have the so-called double diffusion structures, as shown in FIG. 1F etc. described later.

The gate electrodes 15, the sidewalls 17 and the extensions 18 are formed through well-known steps. In other words, oxide films and polysilicon films are deposited on the surfaces of the P wells 11 and the N wells 12 respectively, and parts of the oxide films and the polysilicon films other than the gate oxide films 14 and the gate electrodes 15 are removed by photolithography. The gate electrodes 15 are employed as masks to form the extensions 18 in a self-aligned manner. The extensions 18 are individually formed on the P wells 11 and the N wells 12 respectively. Thereafter an oxide film made of TEOS is thinly formed on the surface of the structure, and a film of SiN to form sidewalls is deposited and etched back to complete the sidewalls 17. Thus, the structure shown in FIG. 1A is obtained.

Figure 1B:
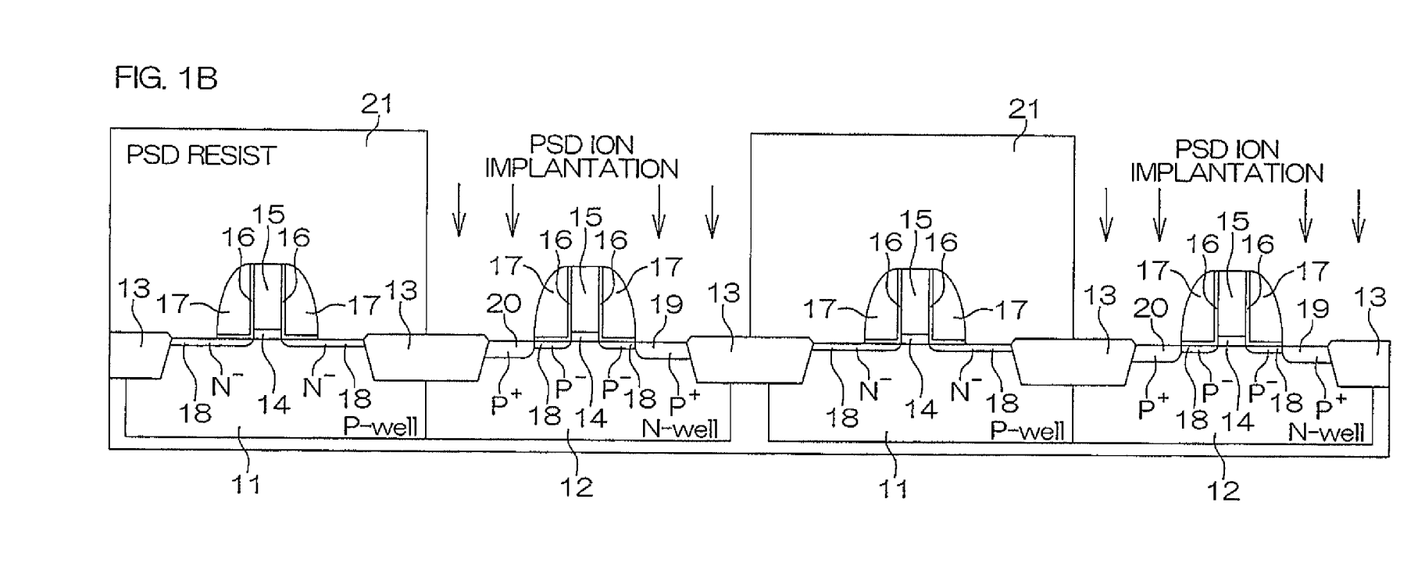
FIG. 1B is a schematic sectional view showing a principal step in the method of manufacturing a CMOS integrated circuit mixedly provided with silicide transistors and non-silicide transistors according to the embodiment of the present invention.

Referring to FIG. 1B, a PSD step is first carried out. In this step, source regions 19 and drain regions 20 of $P^+$ diffusion layers are formed on the surface layer portions of the N wells 12. In order to carry out this step, the upper surfaces of the P wells 11 are first covered with PSD (for forming P-type source/drain regions) resist films 21. More specifically, a PSD resist film 21 is applied to the entire surface of a silicon substrate, and selectively removed from the N wells 12 by photolithography. Then, $P^+$-type PSD ions, for example, are implanted in order to form the diffusion layers 19 and 20. After termination of the ion implantation, the resist films 21 remaining on the P wells 11 are removed by ashing through $O_2$ plasma treatment, for example.

Figure 1C:
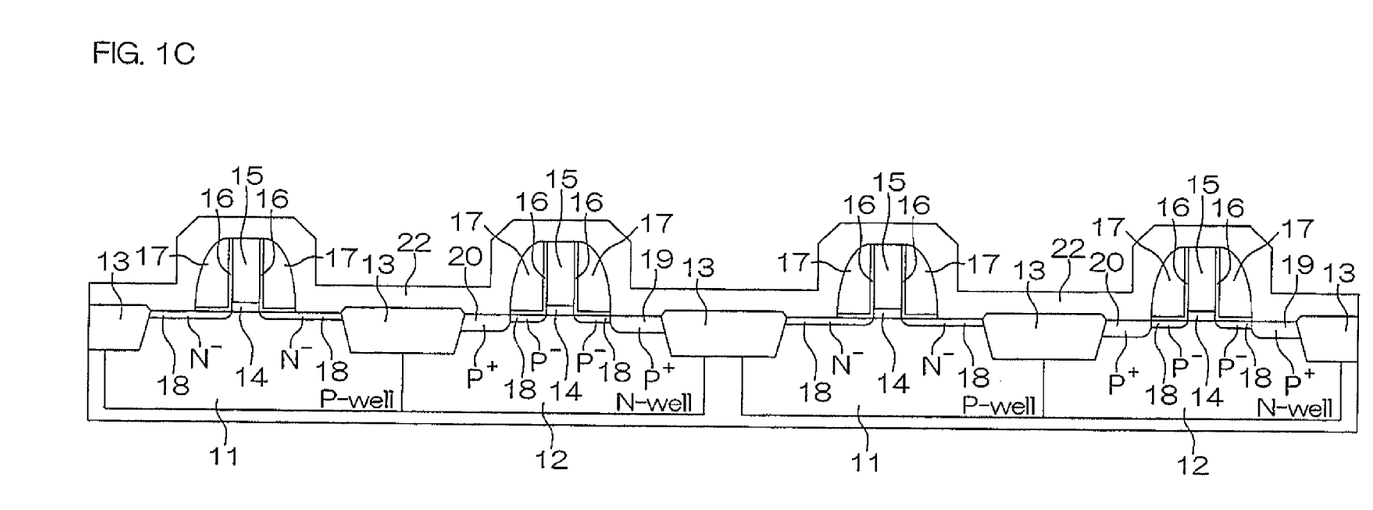
FIG. 1C is a schematic sectional view showing a principal step in the method of manufacturing a CMOS integrated circuit mixedly provided with silicide transistors and non-silicide transistors according to the embodiment of the present invention.

Then, an oxide film 22 made of TEOS is deposited on the entire upper surface of the substrate, as shown in FIG. 1C. The thickness of the oxide film 22 is about 150 to 400 Å.

Figure 1D:
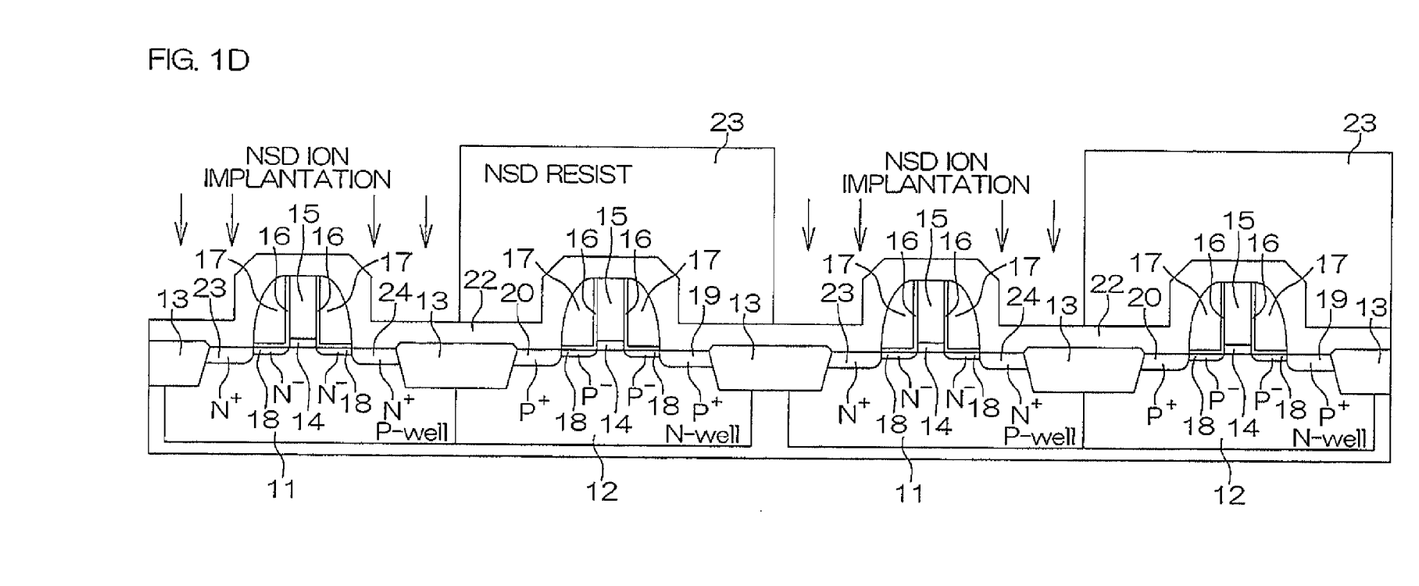
FIG. 1D is a schematic sectional view showing a principal step in the method of manufacturing a CMOS integrated circuit mixedly provided with silicide transistors and non-silicide transistors according to the embodiment of the present invention.

Then, an NSD step is carried out, as shown in FIG. 1D. In this step, the upper portions of the N wells 12 are selectively covered with resist films 23 (resist films for forming N-type source/drain regions; hereinafter referred to as NSD resist films) by photolithography. Then, $As^+$ (arsenic) ions are implanted into the surface layer portions of the P wells 11, in order to form source regions 23 and drain regions 24 of $N^+$ diffusion layers. In this NSD step, the implanted $As^+$ ions punch through polysilicon constituting the gate electrodes 15 unless the oxide film 22 is deposited. In order to prevent the $As^+$ ions from punching through the gate electrodes 15, therefore, the oxide film 22 is formed as a through preventing film. Thus, the source regions 23 and the drain regions 24 positioned by the gate electrodes 15 and the sidewalls 17 in a self-aligned manner can be formed on the surface layer portions of the P wells 11, as shown in FIG. 1D.

Figure 1E:
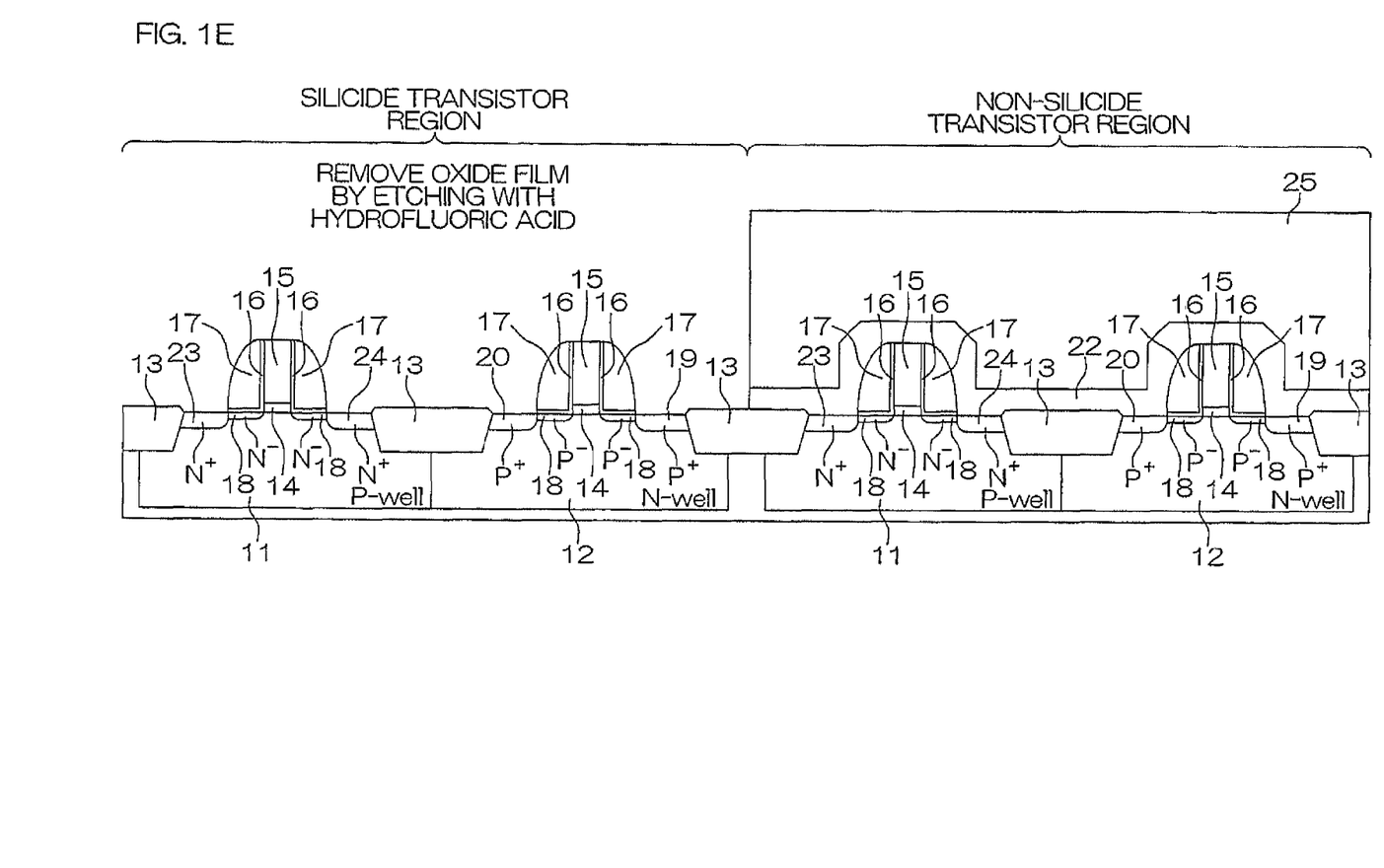
FIG. 1E is a schematic sectional view showing a principal step in the method of manufacturing a CMOS integrated circuit mixedly provided with silicide transistors and non-silicide transistors according to the embodiment of the present invention.
Figure 1F:
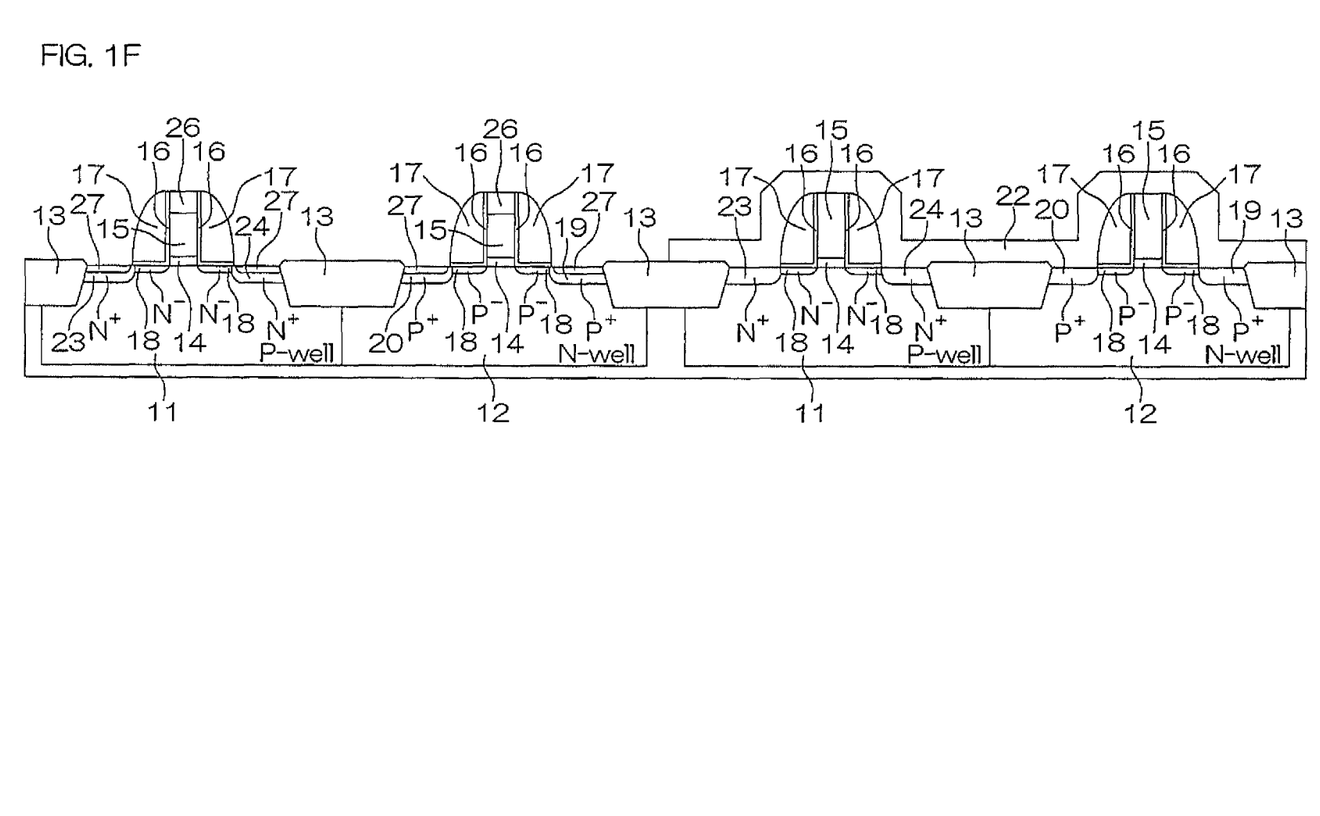
FIG. 1F is a schematic sectional view showing a principal step in the method of manufacturing a CMOS integrated circuit mixedly provided with silicide transistors and non-silicide transistors according to the embodiment of the present invention.

Then, a non-silicide transistor region is covered with a resist film 25 (protective resist film 25) in order to selectively form silicide transistors, as shown in FIG. 1E. This step is also carried out by photolithography, and the protective resist film 25 is left only on the upper surface of the non-silicide transistor region. Thereafter the oxide film 22 covering the upper surface of the silicide transistor region is removed by etching with hydrofluoric acid.

After the oxide film 22 is removed from the upper surface of the silicide transistor region, cobalt is deposited on the entire surface of the substrate by sputtering and annealed at a temperature of about 800° C., thereby forming silicide films 26 and 27 of $CoSi_2$ on the surface layer portions of the gate electrodes 15 and the surface layer portions of the source regions 23 and the drain regions 24 respectively, as shown in FIG. 1F. In this step, the substrate is first subjected to pre-sputtering cleaning, and cobalt is thereafter deposited on the entire surface of the substrate by sputtering. The protective resist film 25 covering the non-silicide transistor region is removed by the annealing for forming the silicide films 26 and 27. The oxide film 22 deposited on the upper surface of the non-silicide transistor region partially forms an interlayer film produced by CVD in a following step, and may not be removed.

This embodiment includes the aforementioned steps described with reference to FIGS. 1A to 1F, and the hydrofluoric acid etching step is carried out only once when forming the mixed structure of the silicide transistors and the non-silicide transistors. Therefore, such an inconvenience can be prevented that the STI oxide films 13 isolating the wells 11 and 12 from each other are excessively scraped off due to overetching at the time of etching by hydrofluoric acid to increase borderless contact leakage.

In other words, the NSD step is carried out after the PSD step according to this embodiment, reversely to the prior art, while the oxide film is deposited on the surface of the substrate only once and removed by the single hydrofluoric acid etching step, whereby the operating characteristics of formed devices can be desiredly maintained.

While the oxide film 22 is made of TEOS (the so-called TEOS film) in the aforementioned embodiment, the oxide film 22 is not necessarily be made of TEOS but may be prepared from another material, so far as the oxide film 22 is removable with hydrofluoric acid and capable of preventing the implanted As⁺ ions from punching through the gate electrodes 15.

Figure 2:
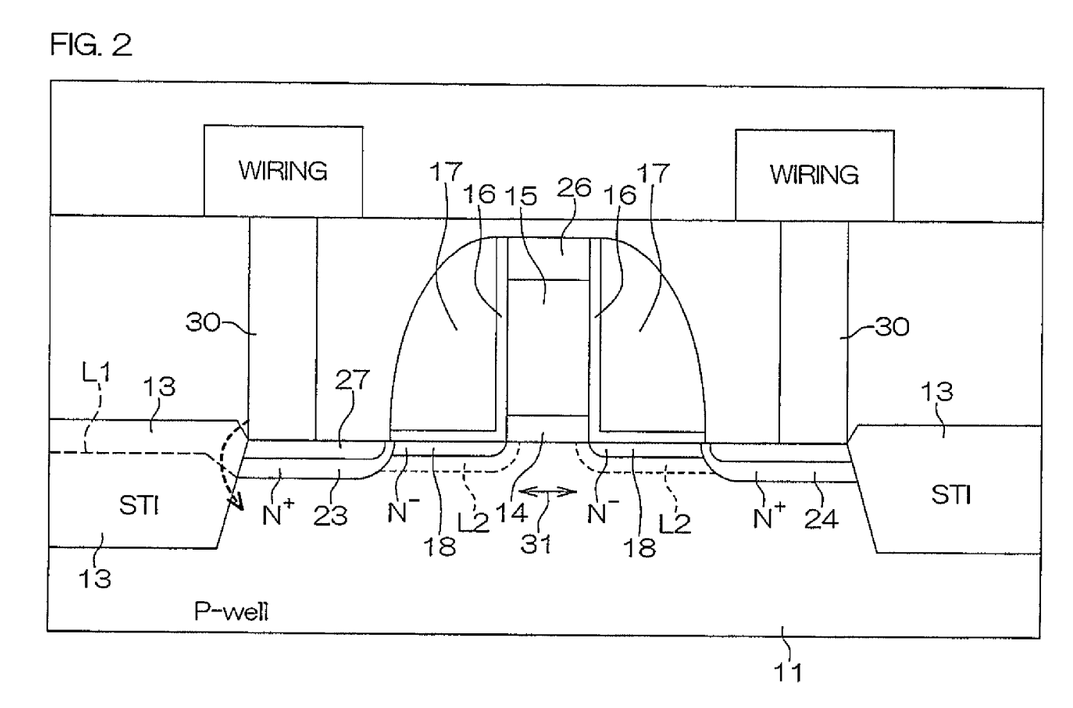
FIG. 2 is a schematic sectional view showing one of the silicide transistors included in the CMOS integrated circuit obtained through the steps in the method of manufacturing a CMOS integrated circuit according to the embodiment of the present invention.

FIG. 2 is a schematic sectional view showing one of the silicide transistors included in the CMOS integrated circuit obtained through the steps in the method of manufacturing a CMOS integrated circuit according to the embodiment of the present invention. The advantages or effects of the steps in the method of manufacturing a CMOS integrated circuit according to the present invention are described with reference to FIG. 2.

The STI oxide film 13 functioning as isolation film is not scraped off (removed) by etching, and an end surface of the source region 23 opposite to the gate electrode 15 is opposed to the corresponding STI oxide film 13. An edge of the drain region 24 opposite to the gate electrode 15 is similarly sufficiently in contact with the corresponding STI oxide film 13. Even if a contact 30 formed on the source region 23 and the STI oxide film 13 are in borderless contact with each other (the contact 30 is so provided as to come into contact with the STI oxide film 13), therefore, a leakage current can be prevented from flowing from the contact 30 into the substrate (well).

Assuming that two hydrofluoric acid etching steps are carried out in order to manufacture the transistor, the STI oxide film 13 may be scraped off up to a degree shown by a broken line L1. If the STI oxide film 13 is scraped off by etching, electrons may transfer as shown by thick arrow in FIG. 2, to result in leakage between the contact 30 and the substrate (well). In the method according to the embodiment of the present invention, however, a leakage margin is so provided as to prevent such leakage.

Further, the oxide film 22 removed by hydrofluoric acid is formed only once, whereby no heat treatment is required for depositing the oxide film 22, and spreading of the extensions (diffusion layers) 18 is suppressed. Referring to FIG. 2, broken lines L2 denote spreading of the extensions 18 resulting from a large amount of heat treatment history. If the extensions 18 spread, the length of a channel region 31 located under the gate electrode 15 is reduced, to result in such a short-channel phenomenon that the source and drain regions 23 and 24 are linked with each other due to punch through. According to the embodiment of the present invention, however, the short-channel characteristics of the transistor can be improved.

Figure 3:
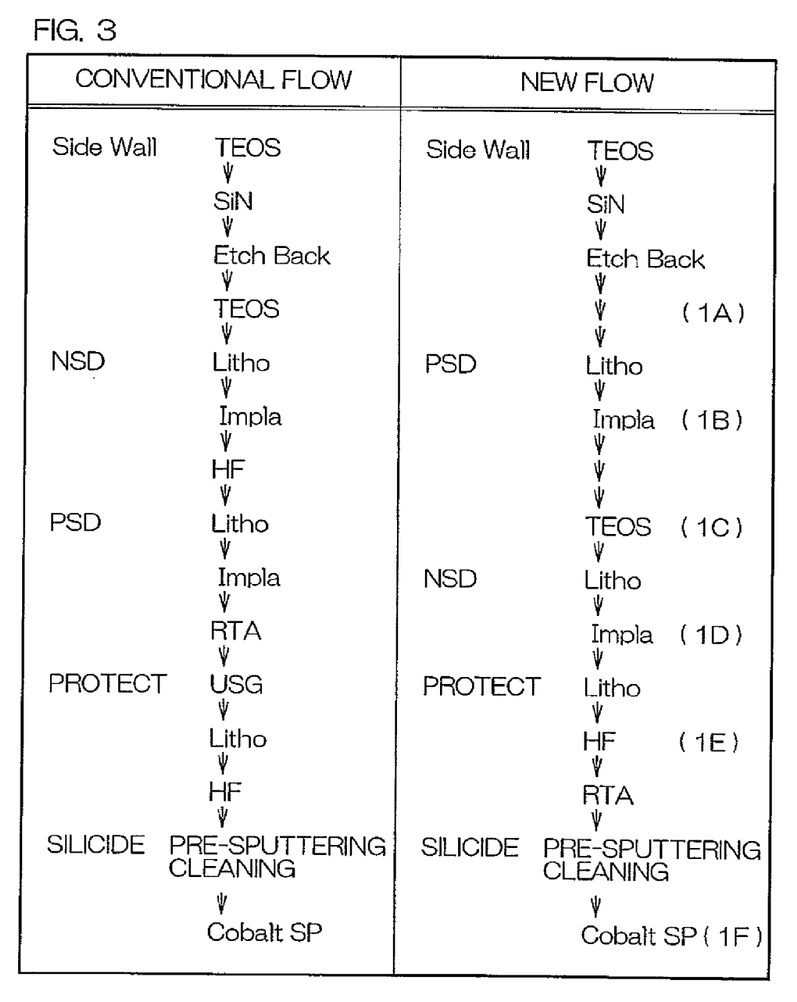
FIG. 3 illustrates the flow of the steps in the method of manufacturing a CMOS integrated circuit according to the embodiment of the present invention in comparison with the flow of conventional steps.

FIG. 3 illustrates the flow of the steps according to the embodiment of the present invention in comparison with the flow of conventional steps. Referring to FIG. 3, numerals "1A" to "1F" correspond to the steps shown in FIGS. 1A to 1F respectively.

The flow of the conventional steps shown in FIG. 3 includes two steps of depositing oxide films and two steps of removing the deposited oxide films.

In the flow of the steps according to the embodiment of the present invention, on the other hand, the oxide film is deposited only once and removed only once.

The present invention is not limited to the aforementioned embodiment, but can be modified in various ways in the range of the scope of claims for patent.

For example, while the embodiment is described with reference to the transistors each having the gate electrode sandwiched between the pair of sidewalls, the manufacturing method of the present invention is also applicable to a transistor having a sidewall only on one side or a transistor having no sidewall.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

What is claimed is:

1. A CMOS integrated circuit mixedly provided with a silicified transistor and a non-silicified transistor comprising:
    a semiconductor substrate;
    P wells and N wells on a surface layer region of the semiconductor substrate;
    STI isolation oxide films which are formed between the P wells and the N wells isolating the P wells and the N wells from each other;
    gate electrodes, each of the wells having a gate electrode disposed thereupon;
    P-type source and P-type drain regions on the N wells that are formed as a result of a PSD step;
    N-type source and N-type drain regions formed on the P wells by depositing an oxide film on the surface of the substrate, selectively covering the N wells with a first resist film, and implanting ions into a surface of the substrate through the deposited oxide film as a result of an NSD step;
    a silicide provided on the gate electrodes, the source and the drain regions of a first of the N wells and a first of the P wells from both of which the oxide film is removed by the steps of selectively removing the first resist film, thereafter selectively covering a second of the N wells and a second of the P wells to form a non-silicide transistor that is not subjected to silicide formation with a second resist film so as to not form silicide in the non-silicide transistor, and then removing the oxide film from the first N well and the first P well that both constitute a silicide transistor; and
    an interlayer oxide film directly deposited on the STI isolation oxide films, wherein the interlayer oxide film of the non-silicide transistor is disposed so as to not touch the silicide transistor.

2. The CMOS integrated circuit according to claim 1, wherein the ions implanted into the surface in the NSD step are As ions for forming the N-type source and drain regions.

3. The CMOS integrated circuit according to claim 2, wherein hydrofluoric acid is employed for selectively removing the oxide film.

4. The CMOS integrated circuit according to claim 1, wherein hydrofluoric acid is employed for selectively removing the oxide film.

5. A CMOS integrated circuit comprising:
    a semiconductor substrate having a surface layer region;
    a silicide transistor including
        a first P well on the surface layer region,
        a first N well on the surface layer region,
        a first STI isolation oxide film formed between the first P well and the first N well so as to isolate the first P well from the first N well,
        first gate electrodes disposed on each of the first N well and the first P well,
        a first P-type source region on the first N well,
        a first P-type drain region on the first N well,
        a first N-type source region on the first P well,
        a first N-type drain region on the first P well, and a silicide provided on the first gate electrodes, the first P-type source region, the first P-type drain region, the first N-type source region and the first N-type drain region; and a non-silicide transistor including
   a second P well on the surface layer region,
   a second N well on the surface layer region,
   a second STI isolation oxide film which is formed between the second P well and the second N well so as to isolate the second P well and the second N well from each other,
   second gate electrodes disposed on each of the second P well and the second N well,
   a second P-type source region on the second N well,
   a second P-type drain region on the second N well,
   a second N-type source region on the second P well,
   a second N-type drain region on the second P well,
   wherein no silicide is provided on the second gate electrodes, the second P-type source region, the second P-type drain region, the second N-type source region and the second N-type drain region, and
an interlayer oxide film disposed on the STI isolation oxide film, wherein the interlayer oxide film of the non-silicide transistor is disposed so as to not touch the silicide transistor.

6. The CMOS integrated circuit according to claim 5, further comprising a third STI isolation oxide film that extends from the non-silicide transistor to the silicide transistor.

7. The CMOS integrated circuit according to claim 6, wherein the interlayer oxide film of the non-silicide transistor is disposed on the third STI isolation oxide film.

8. The CMOS integrated circuit according to claim 6, wherein the interlayer oxide film of the non-silicide transistor is disposed on the second gate electrodes, the second P-type source region, the second P-type drain region, the second N-type source region, the second N-type drain region and the third STI isolation oxide film.

9. The CMOS integrated circuit according to claim 6, wherein the interlayer oxide film of the non-silicide transistor touches the second gate electrodes, the second P-type source region, the second P-type drain region, the second N-type source region, the second N-type drain region and the third STI isolation oxide film.

10. The CMOS integrated circuit according to claim 9, wherein the entire interlayer oxide film is continuous and unbroken.

11. The CMOS integrated circuit according to claim 5, wherein no silicide touches the second gate electrodes, the second P-type source region, the second P-type drain region, the second N-type source region and the second N-type drain region.

* * * * *